United States Patent
Shim

(10) Patent No.: US 6,617,909 B2
(45) Date of Patent: Sep. 9, 2003

(54) PHASE BLENDER AND MULTI-PHASE GENERATOR USING THE SAME

(75) Inventor: Dae-yun Shim, Kwangmyung (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/961,270

(22) Filed: Sep. 25, 2001

(65) Prior Publication Data

US 2002/0140491 A1 Oct. 3, 2002

(30) Foreign Application Priority Data

Feb. 17, 2001 (KR) .......................................... 2001-8033

(51) Int. Cl.[7] ................................................. G06G 7/12
(52) U.S. Cl. ........................ 327/355; 327/361; 327/269
(58) Field of Search ................................. 327/355, 361, 327/233, 235, 108, 112, 113, 254, 255, 256, 257, 258, 259, 269, 271; 326/23, 27, 82, 83, 85, 87

(56) References Cited

U.S. PATENT DOCUMENTS 4,308,617 A * 12/1981 German, Jr. .................... 375/1
4,896,374 A * 1/1990 Waugh et al. ................. 455/326
5,099,202 A * 3/1992 Claydon et al. .............. 327/133
5,672,991 A * 9/1997 Thoma et al. ................ 327/239
6,393,083 B1 * 5/2002 Beukema ...................... 375/371

* cited by examiner

Primary Examiner—Timothy P. Callahan
Assistant Examiner—An T. Luu
(74) Attorney, Agent, or Firm—Sughrue Mion, PLLC

(57) ABSTRACT

Disclosed are a phase blender for generating an output voltage having a phase difference with respect to first and second input voltages having a phase difference and a multi-phase generator using the same. The phase blender has first and second phase delay units having phases corresponding to the phases of the first and second input voltages respectively, an intermediate phase output unit for outputting third and fourth output voltages having an intermediate phase of the first and second input voltages, and an output selection unit for selecting and outputting two of various output voltages. The multi-phase generator is constituted with the phase blenders connected in series, so that the phase blender of the final stage in the multi-phase generator outputs one of various output voltages having an intermediate phase of the first and second input voltages. Therefore, a multi-phase generator is provided which has a small power consumption.

13 Claims, 12 Drawing Sheets

PHASE BLENDER AND MULTI-PHASE GENERATOR USING THE SAME

BACKGROUND OF THE INVENTION

1. Field of the Invention

The present invention relates to a phase blender and a multi-phase generator using the same, and more particularly to a phase blender for generating, by using input voltages having a phase difference, an output voltage corresponding to an intermediate phase, and a multi-phase generator for generating output voltages having an arbitrary phase difference by using the phase blender. The present application is based on Korean Patent Application No. 2001-8033, which is incorporated herein by reference.

2. Description of the Related Art

In order to realize the phase locked loop (PLL) or a delayed locked loop (DLL) as a clock generator using a phase blending mode, signals with diverse phases each delayed by a different amount are required to be inputted, or a phase blender which outputs various signals having a smaller phase difference than a phase difference of two inputted signals is required, as well as a multi-phase generator using such a phase blender.

It is referred to as "delay mixing" or "delay interpolation" to control a delay amount of an output signal with respect to two input signals having a delay difference, and an actual output signal is additionally delayed by a group delay of an entire system. In order to obtain such characteristics, an output signal may be generated by controlling a ratio of the current sources of two signals and adding the controlled ratio, and a fine-tap may be obtained by colliding two delayed signals using an inverter (related documents: B. W Garlepp et al., A portable digital DLL for high-speed CMOS interface circuit, IEEE J. Solid-state Circuits, vol. 34, pp.632–644, May 1999, and S. Sidiropoulos, High-performance interchip signaling, Ph.D. dissertation, Available as Tech. Rep. CLS-TR-98-760 from http://elib.stanford.edu Computer Systems Lab., Stanford University).

A phase blender inputs a selection code of N bits with respect to two inputs Vin1 and Vin2 having a delay time $\Delta t$ and generates an output signal with the $\Delta t$ divided by $\frac{1}{2}^N$. Accordingly, a signal with a minimum delay time should be outputted in case that an N-bit code is '0', a signal with a maximum delay time should be outputted in case of $2^N-1$, and, in case that an arbitrary value between '0' and '$2^N-1$', a signal with linear delay characteristics corresponding to the value should be outputted.

FIG. 1 shows a conventional phase blender. The phase blender shown in FIG. 1 takes a mode that generates an output signal having an intermediate delay amount by using an output of a CMOS inverter. A detailed description will be as follows (that two signals contrasted have a phase difference means that the two have a time difference as large as and corresponding to the phase difference in a time domain, so the same meaning applies to the phase difference and the time difference).

To a phase blender 20 are inputted two input voltages Vin1 and Vin2 having a phase difference, and the phase blender 20 outputs three output voltages Vout1, Vout2, and Vout3 having different phases from each other. The phase blender 20 has first and second phase delay units 21 and 22 to which the first and second input voltages Vin1 and Vin2 are respectively inputted, and an intermediate phase output unit 30 to which the first and second input voltages Vin1 and Vin2 are inputted. The first and second phase delay units 21 and 22 output the first and second output voltages having phases respectively corresponding to the phases of the first and second input voltages Vin1 and Vin2, and the intermediate phase output unit 30 outputs a third output voltage Vout3 having a phase corresponding to an intermediate phase of the first and second input voltages Vin1 and Vin2.

The intermediate phase output unit 30 has a pair of first inverters 31a and 31b whose output ports are mutually connected and to which the first and second input voltages Vin1 and Vin2 are inputted, and a second inverter 32 for inputting the output voltages of the first and second inverters 31a and 31b and outputting a third output voltage Vout3. Further, the first phase delay unit 21 is constituted with a pair of third inverters 21a and 21b connected in series, and the second phase delay unit 22 is constituted with a pair of third inverters 22a and 22b connected in series.

A detailed circuit for each inverter shown in FIG. 1 is shown in FIG. 2. Each inverter includes a PMOS(MP0) transistor and an NMOS(MN0) transistor connected in series. The source of the PMOS(MP0) transistor is applied with a source voltage $V_{DD}$, the source of the NMOS(MN0) transistor is grounded. Further, the drains of the PMOS (MP0) and NMOS(MN0) transistors are mutually connected. An input voltage Vin is respectively inputted to the gates of the PMOS(MP0) and NMOS(MN0) transistors, and an output voltage Vout is outputted from the drains, that is, from a connection portion of the PMOS(MP0) and NMOS (MN0) transistors. The PMOS(MP0) and NMOS(MN0) transistors operate as switches which are switched according to the input voltage Vin. At this time, a switching mode is the same as follows.

| Vin | PMOS(MP0) | NMOS(MN0) | Vout |
|-----|-----------|-----------|------|
| high | off | on | low |
| low | on | off | high |

The PMOS(MP0) and NMOS(MN0) transistors are simply described, in the above table, to be turned on or off in operations, but the PMOS(MP0) and NMOS(MN0) transistors vary their resistance values according to a change of a magnitude of the input voltage Vin to operate as variable resistors varying from a short state (or an open state) to the open state (or a short state) substantially. Further, in view of the input voltage, a virtual capacitor $C_0$ is supposed to be connected to an input stage of the inverter.

FIG. 3 is a graph for showing a relationship between the input voltage and output voltages of the inverter shown in FIG. 2. The input voltage Vin, based on the operations as shown in the table, is outputted as an output voltage with its phase inverted. At this time, the switching operations of the PMOS(MP0) and NMOS(MN0) transistors in the inverter are accompanied by a certain time delay, so that, as shown in FIG. 3, the phase-inverted output voltage Vout is outputted after a predetermined delay time.

FIG. 4 is a graph for showing a relationship of the inputs and outputs of a conventional phase blender as shown in FIG. 1.

If the first input voltage Vin1 is inputted to the first phase delay unit 21, the first output voltage Vout1 is outputted in the same waveform as in the first input voltage Vin1 since the first phase delay unit 21 includes the two inverters 21a and 21b. At this time, a waveform delayed by a predetermined delay time by the two inverters 21a and 21b is outputted. With respect to the second input voltage Vin2, the second phase delay unit 22 outputs the second output voltage Vout2 having the same waveform as the second input voltage Vin2 but delayed by the delay time. Accordingly, the first and second phase delay units 21 and 22 output the first and second output voltages Vout1 and Vout2 having phases corresponding to the phases of the first and second input voltages Vin1 and Vin2.

If the first and second input voltages Vin1 and Vin2 are inputted with a certain time difference Δt, the intermediate phase output unit 30 outputs the third output voltage Vout3 lagged by ½ Δt compared to the first output voltage Vout1 and preceded by ½ Δt compared to the second output voltage Vout2, which is a signal inverted at the intermediate point of the inverting points of the first and second input voltages Vin1 and Vin2. At this time, the third output voltage Vout3 has the same delay time as in the first and second output voltages Vout1 and Vout2. Accordingly, the third output voltage Vout3 is outputted which has a phase corresponding to an intermediate phase of the first and second input voltages Vin1 and Vin2.

When modeling the above phase blender, under the assumption that the two input voltages Vin1 and Vin2 drive the second inverter 32 at different times, a method is used which approximates the above phase blender with mathematical formulas of current sources and RC charges/discharges. Accordingly, as a delay time in one phase blender is obtained, in case that the magnitudes of the first inverters 31a and 32b are the same, the delay time can not be in the center of the edges of the two input voltages Vin1 and Vin2. Accordingly, in order to obtain the output voltage Vout3 of an intermediate phase, the magnitudes of the two inverters 31a and 31b are adjusted. At this time, a ratio of the magnitudes of the inverters 31a and 31b is about 1.2:1.

FIG. 5 is a view for showing a conventional multi-phase generator for generating multiple phases using the phase blender as shown in FIG. 1, which substantially shows a multi-phase generator having eight phase differences.

There is one phase blender 20a present at a first stage of the multi-phase generator, two phase blenders 20b at a second stage, and four phase blenders 20c at a third stage. Of three output voltages from the first stage, the output voltages Vout1 and Vout2 of the phase delay units 21 and 22 are inputted to the phase blenders 20b of the second stage respectively, and the output voltage Vout3 of the intermediate phase output unit 30 is inputted to all the phase blenders 20b of the second stage. The above method is commonly applied to the phase blenders 20a or 20b of the prior stage and the phase blenders 20a or 20b of the next stage. The outputs of the third stage are inputted to a multiplexer 40.

By connecting the phase blenders in multiple steps as stated above, voltages Vout1, Vout2, and Vout3 having a phase difference of ½ Δt with respect to a phase difference Δt of the input voltages Vin1 and Vin2 are outputted at the first stage. By the same principle, voltages having a phase difference of ¼ Δt are outputted at the second stage, and voltages having a phase difference of ⅛ Δt are outputted at the third stage. The multiplexer 40 selects one of the eight output voltages having such multiple phases, and, accordingly, one of the eight voltages having a phase difference of ⅛ compared to the phase difference Δt of the input voltages Vin1 and Vin2 is selected and outputted.

However, in such a conventional structure, there is a problem in that the size of the entire circuit rapidly increases as the number of signals having intermediate phases to be generated in realizing a multi-phase generator increases. That is, as the number of the stages in the multi-phase generator increases, the number of phase blenders required increases exponentially. Further, the size of the circuit for multiplexing many intermediate signals increases in order to generate signals finally required. Accordingly, there exists a problem in that the size of the circuit, as well as power consumption, exponentially increase.

Further, in modeling the operations of a phase blender corresponding to each cell in a multi-phase generator, there is a problem in that the entire operations rely on the RC filtering. Accordingly, the operation characteristics become nonlinear, so the stabilization of the operations as to changes of processes, voltages, and temperatures becomes particularly important.

SUMMARY OF THE INVENTION

The present invention has been devised to solve the above problems, so it is an object of the present invention to provide a multi-phase generator having a smaller circuit size compared to a conventional multi-phase generator of a parallel structure and capable of minimizing a nonlinear effect due to the RC filtering of signals.

Further, it is an object of the present invention to provide a phase blender of a new structure suitable for realizing the above multi-phase generator.

In order to achieve the above objects, the present invention provides a phase blender comprising: first and second phase delay units for respectively inputting first and second input voltages having a certain phase difference from each other, and outputting first and second output voltages having phases corresponding to phases of the first and second input voltages respectively; an intermediate phase output unit having a pair of first inverters the output ports of which are mutually connected and for inputting the first and second input voltages respectively, and a pair of second inverters for inputting the output voltages of the first inverters and outputting third and fourth output voltages respectively; and an output selection unit having a first multiplexer for selectively outputting the first and third output voltages, and a second multiplexer for selectively outputting the second and fourth output voltages.

Here, the first and second inverters each include PMOS and NMOS transistors which perform mutually opposite switching operations according to the magnitudes of the voltages inputted to the gates thereof, and the first and second input voltages are inputted to the gates of the PMOS and NMOS transistors, whereby the third and fourth output voltages have an intermediate phase between the phases of the first and second output voltages.

According to a preferable embodiment of the present invention, the phase blender includes a unit for delaying rising times of the first and second input voltages. Here, the delaying unit may be constituted with a delay inverter having a size smaller than the respective inverters and installed at portions to which the first and second input voltages are inputted. Further, the delaying unit may be a capacitor for charging the first and second input voltages, or a floating inverter having an opened output port and performing a function of a dummy capacitor with respect to the first and second input voltages.

By such delaying unit, the rising times of two input voltages increase, so that a stable intermediate phase can be outputted with respect to the two input voltages having a large phase difference.

In the meantime, a multi-phase generator according to the present invention comprises a first phase blender for inputting first and second input voltages having a certain phase difference and outputting at least two voltages having phases corresponding to phases of the first and second input voltages and voltages having a phase corresponding to an intermediate phase of the input voltages; and at least one second phase blender sequentially connected in series to the first phase blender, and for performing the same function as the first phase blender. The phase blender according to the present invention, as stated above, is employed for each phase blender constituting the multi-phase generator. According to the present invention, a multi-phase generator having a small circuit size and power consumption is provided.

BRIEF DESCRIPTION OF THE DRAWINGS

The above objects and other advantages of the present invention will become more apparent by describing in detail preferred embodiments thereof with reference to the attached drawings, in which.

DETAILED DESCRIPTION OF THE PREFERRED EMBODIMENTS

Hereinafter, the present invention will be described in more detail with reference to the accompanying drawings.

Figure 1:
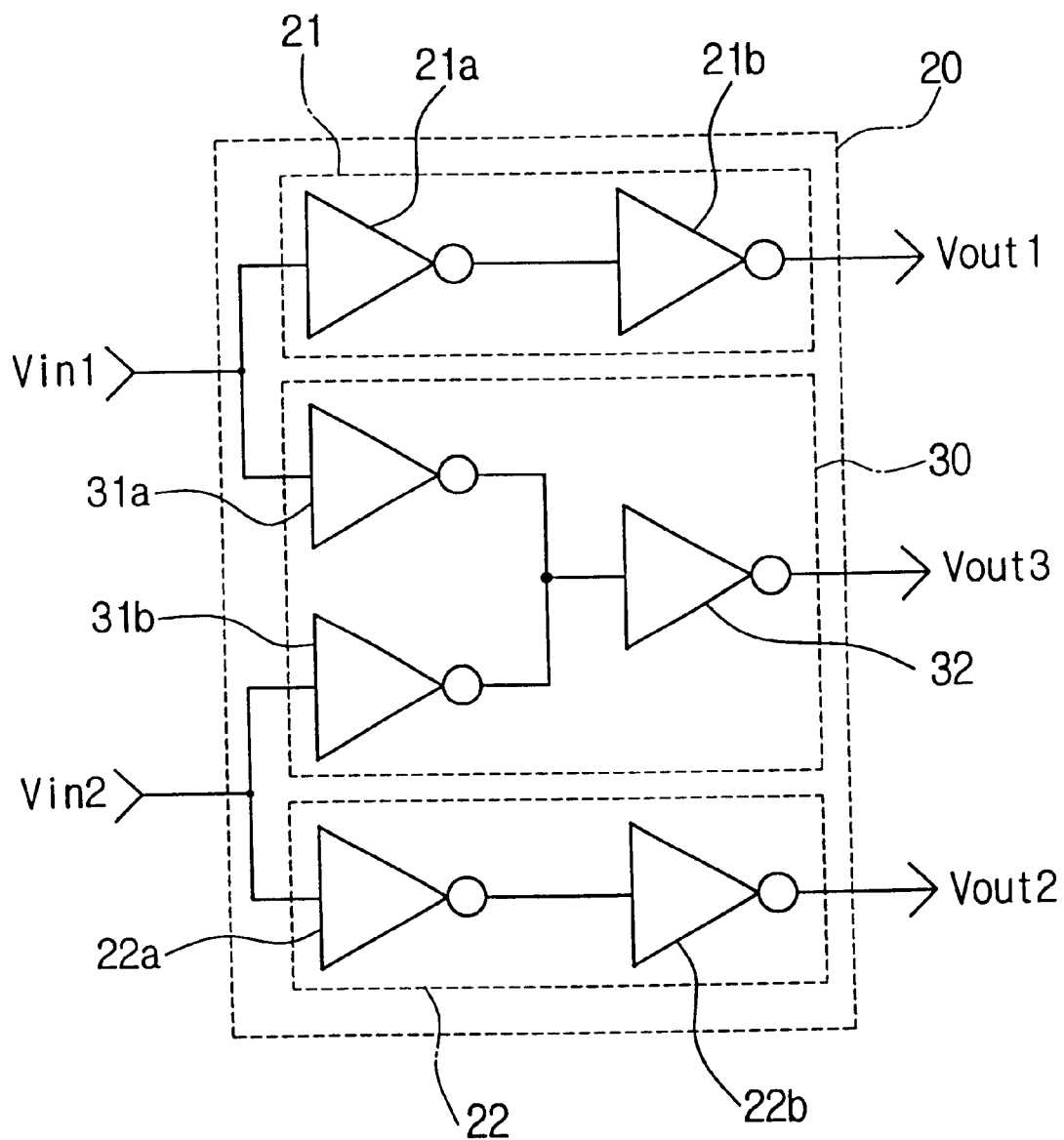
FIG. 1 is a block diagram for showing a conventional phase blender.
Figure 2:
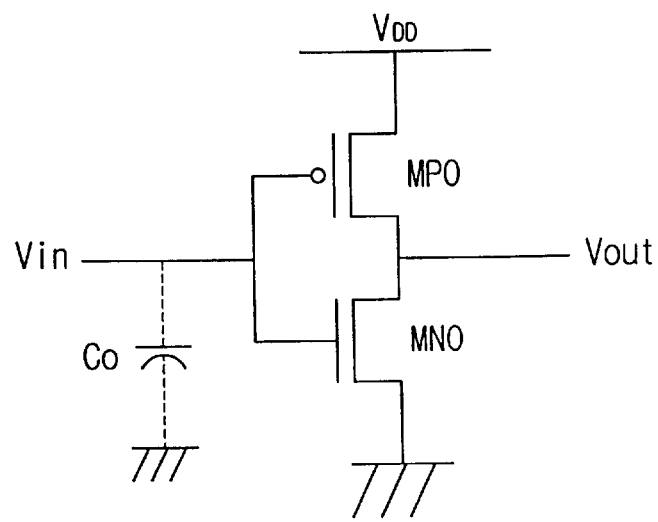
FIG. 2 is a circuit for showing a structure of each inverter shown in FIG. 1.
Figure 3:
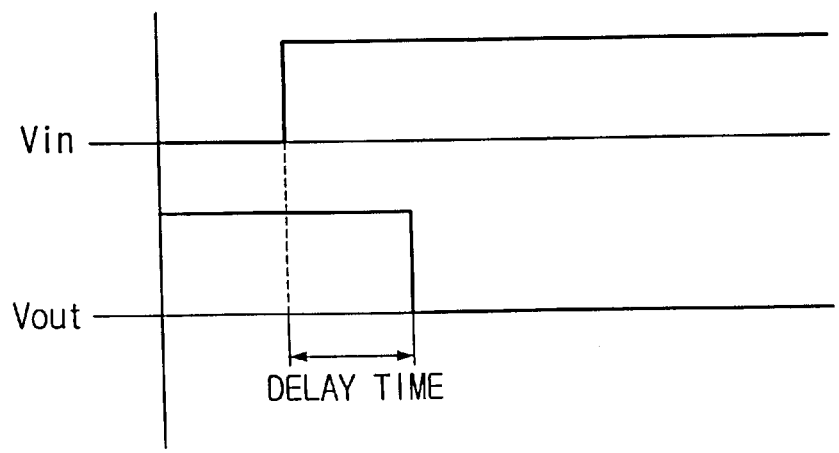
FIG. 3 is a graph for showing a relationship of input and output voltages of the inverter shown in FIG. 2.
Figure 4:
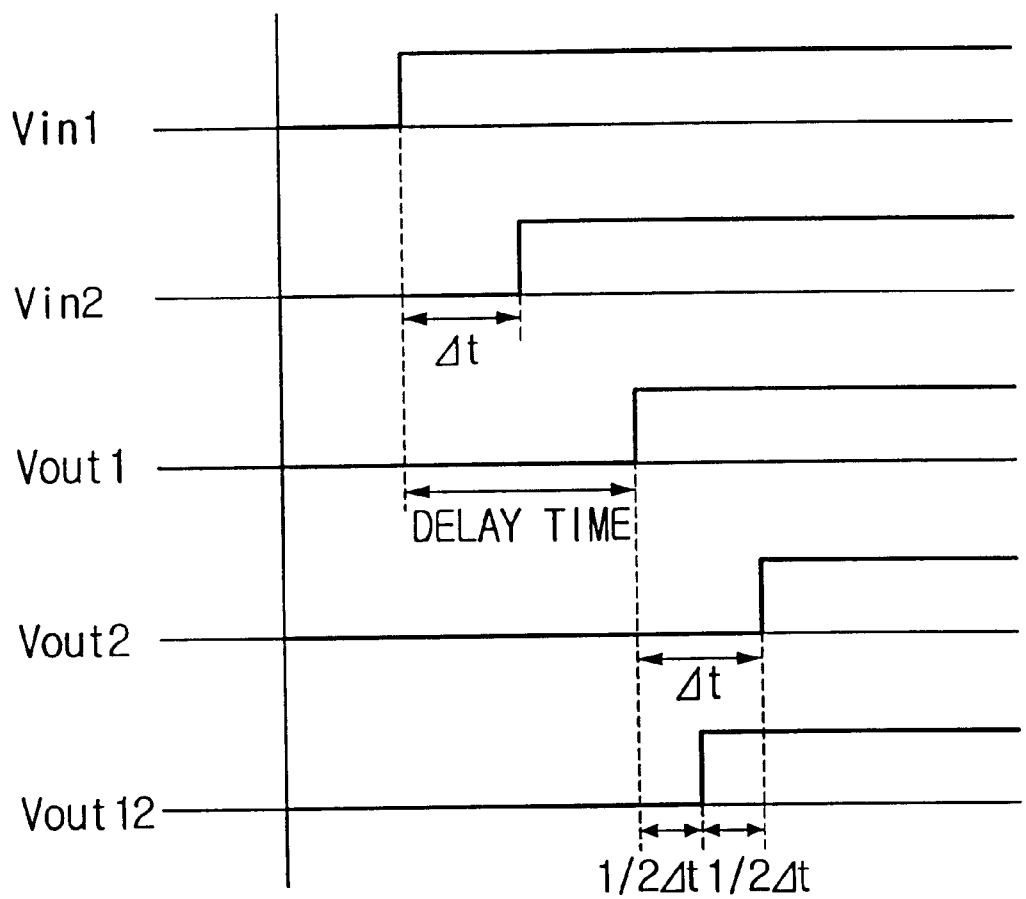
FIG. 4 is a graph for showing a relationship of input and output voltages of the inverter shown in FIG. 1.
Figure 5:
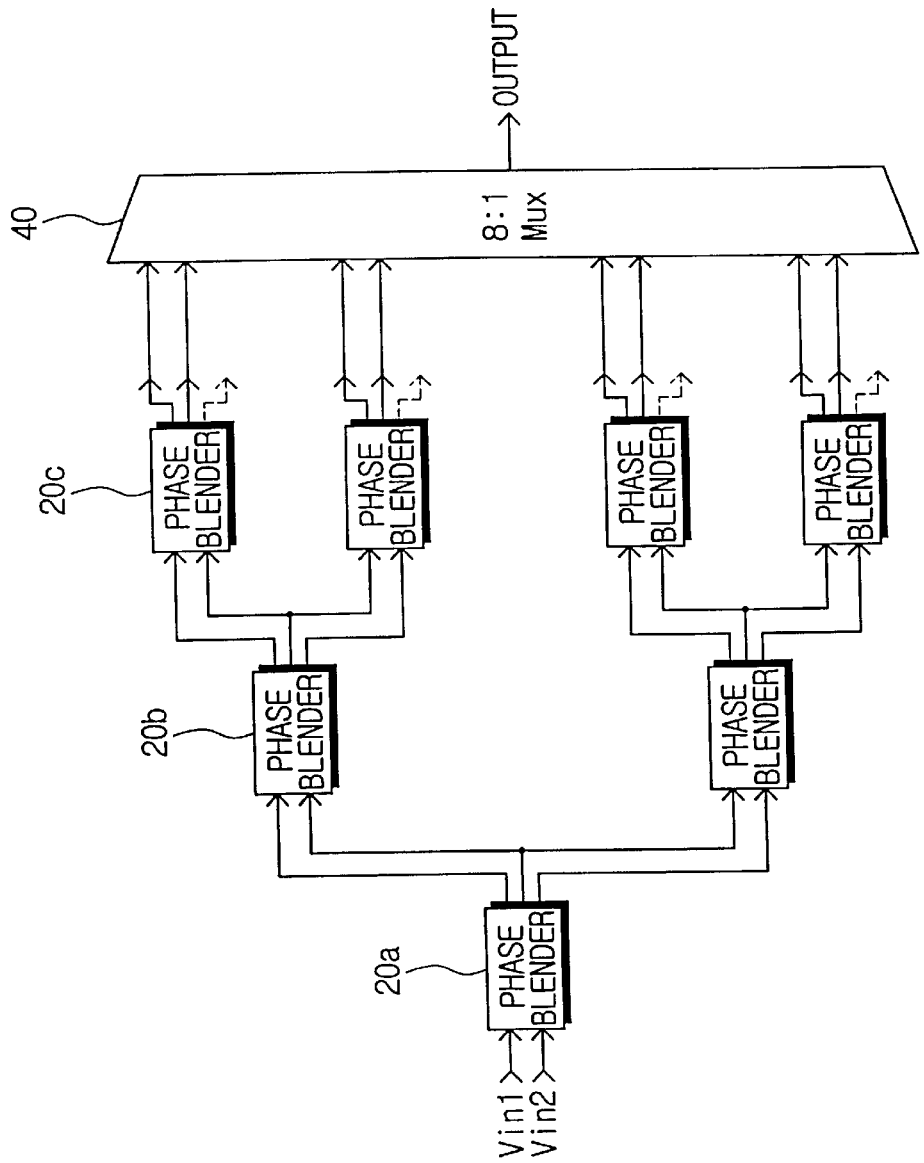
FIG. 5 is a block diagram for showing a conventional multi-phase generator.
Figure 6:
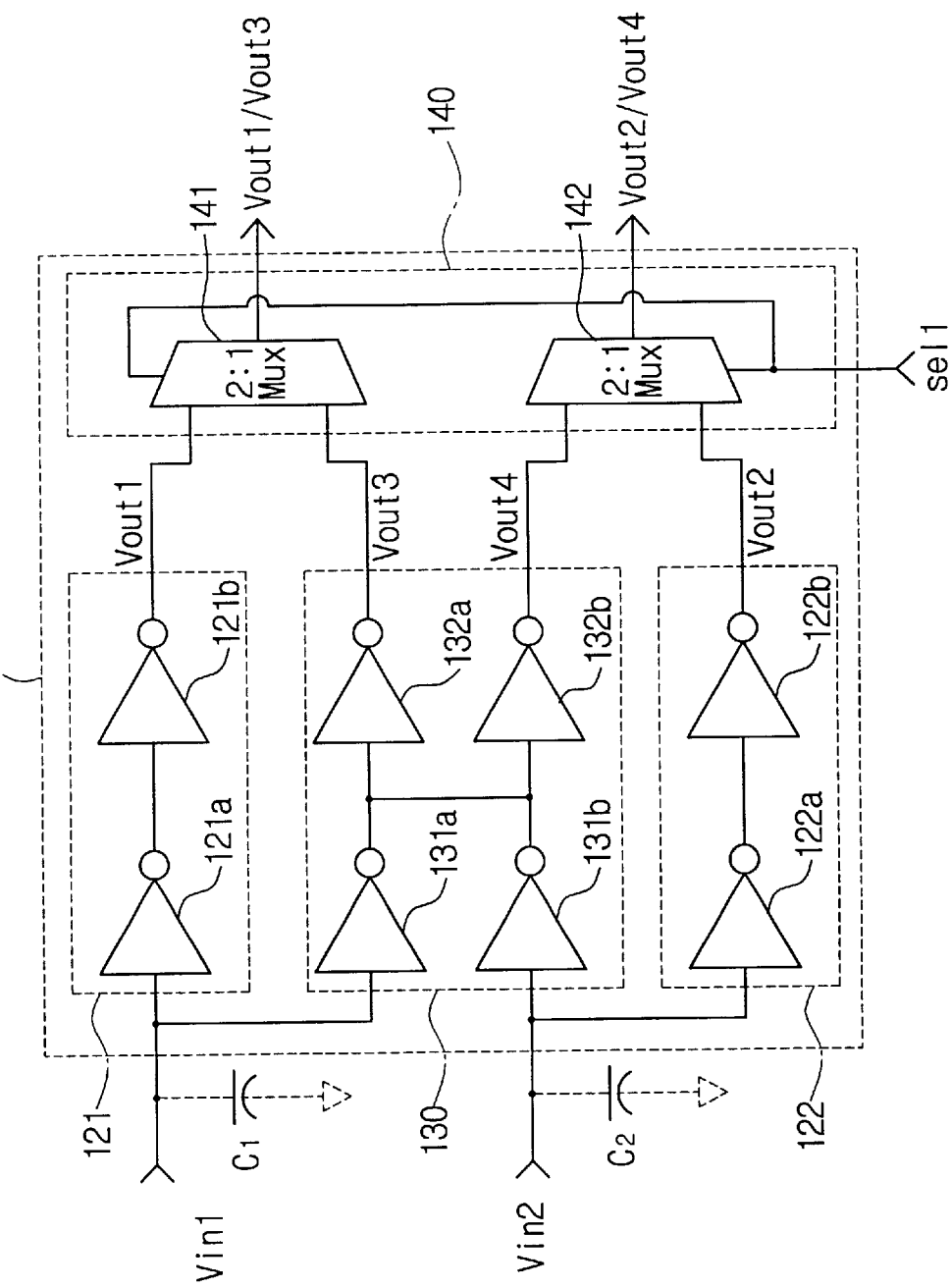
FIG. 6 is a block diagram for showing a phase blender according to an embodiment of the present invention.

FIG. 6 is a block diagram for showing a phase blender according to an embodiment of the present invention. A phase blender 120 has first and second phase delay units 121 and 122 for inputting first and second input voltages Vin1 and Vin2 respectively, an intermediate phase output unit 130 for inputting the first and second input voltages Vin1 and Vin2, and an output selection unit 140 for selecting two output voltages of four output voltages Vout1, Vout2, Vout3, and Vout4.

The first and second phase delay units 121 and 122 each have a pair of third inverters 121a, 121b, 122a, and 122b, respectively, connected in series. The first and second phase delay units 121 and 122 output the first and second output voltages Vout1 and Vout2 having phases corresponding to the phases of the first and second input voltages Vin1 and Vin2, respectively.

The intermediate phase output unit 130 has a pair of first inverters 131a and 131b for inputting the first and second input voltages Vin1 and Vin2 respectively, the pair of first inverters being mutually connected at their output ports, and a pair of second inverters 132a and 132b for inputting the output voltages of the first inverters 131a and 131b and outputting the third and fourth output voltages Vout3 and Vout4. The second inverters 132a and 132b of the intermediate phase output unit 130 output the third and fourth output voltages Vout3 and Vout4 having phases corresponding to an intermediate phase of the first and second input voltages Vin1 and Vin2.

Figure 7:
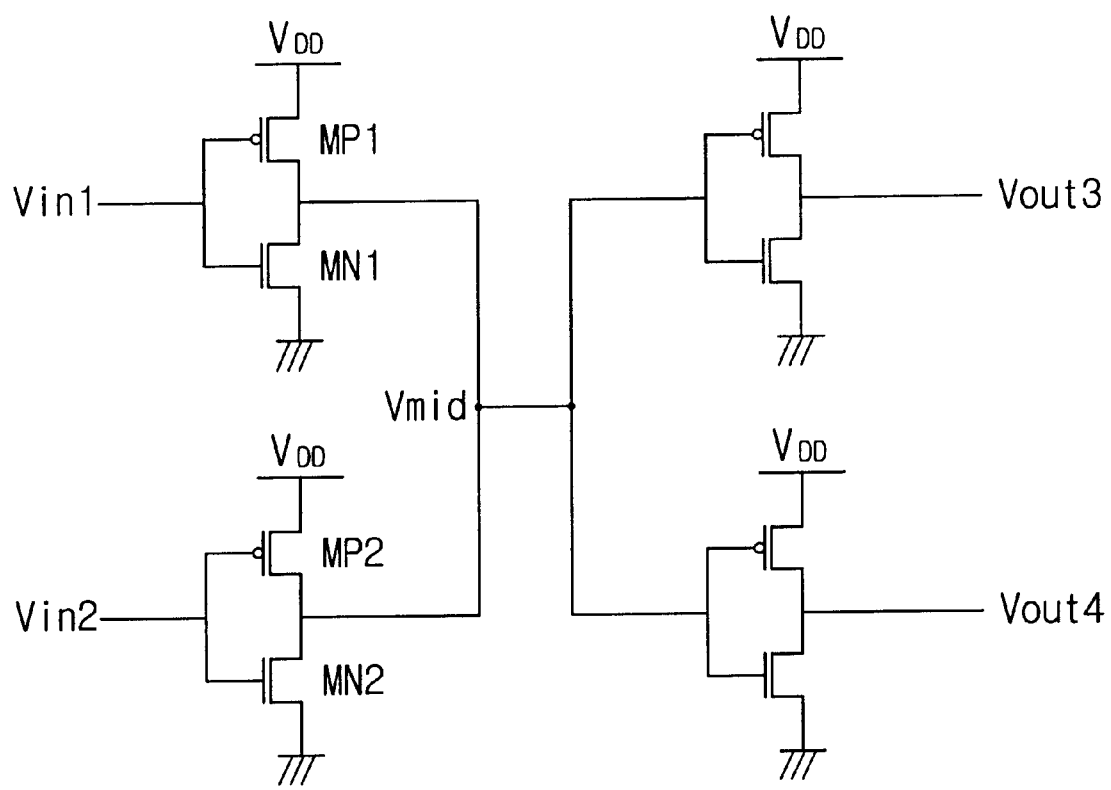
FIG. 7 is a circuit for showing an intermediate phase output unit of FIG. 6.

A detailed circuit of an intermediate phase output unit 30 in the phase blender shown in FIG. 6 is shown in FIG. 7.

The first inverters 131a and 131b include PMOS transistors MP1 and MP2 and NMOS transistors MN1 and MN2, where transistors MP1 and MN1 are connected in series and transistors Mp2 and MN2 are connected in series. A source voltage $V_{DD}$ is applied to the sources of the PMOS transistors MP1 and MP2 respectively, and the drains of the PMOS transistors MP1 and MP2 and NMOS transistors MN1 and MN2 are connected to each other, and, further, the sources of the NMOS transistors MN1 and MN2 are grounded. The first input voltage Vin1 is inputted to the gates of the PMOS transistor MP1 and NMOS transistor MN1, respectively. The second input voltage Vin2 is inputted to the gates of the PMOS transistor MP2 and NMOS transistor MN2, respectively. An intermediate output voltage Vmid is outputted at a point that the drains of the PMOS MP1 and NMOS MN1 and the drains of the PMOS MP1 and NMOS MN1 are commonly connected. The respective PMOS PM1 and MP2 and NMOS MN1 and MN2 operate as switches that are switched according to input voltages. At this time, a switching method is the same as described in the prior art.

The second inverters 132a and 132b, as in the first inverters 131a and 131b, each include a PMOS transistor, the source of which is connected to the source voltage $V_{DD}$, and an NMOS transistor, the drain of which is connected to the drain of the PMOS transistor and the source of which is grounded. The intermediate output voltage Vmid is inputted to the second inverters 132a and 132b, and the respective output voltages Vout3 and Vout4 of the second inverters 132a and 132b, as in the first inverters 131a and 131b, are outputted at connection points of the PMOS and NMOS transistors of the second inverters 132a and 132b, that is, drains.

Figure 8:
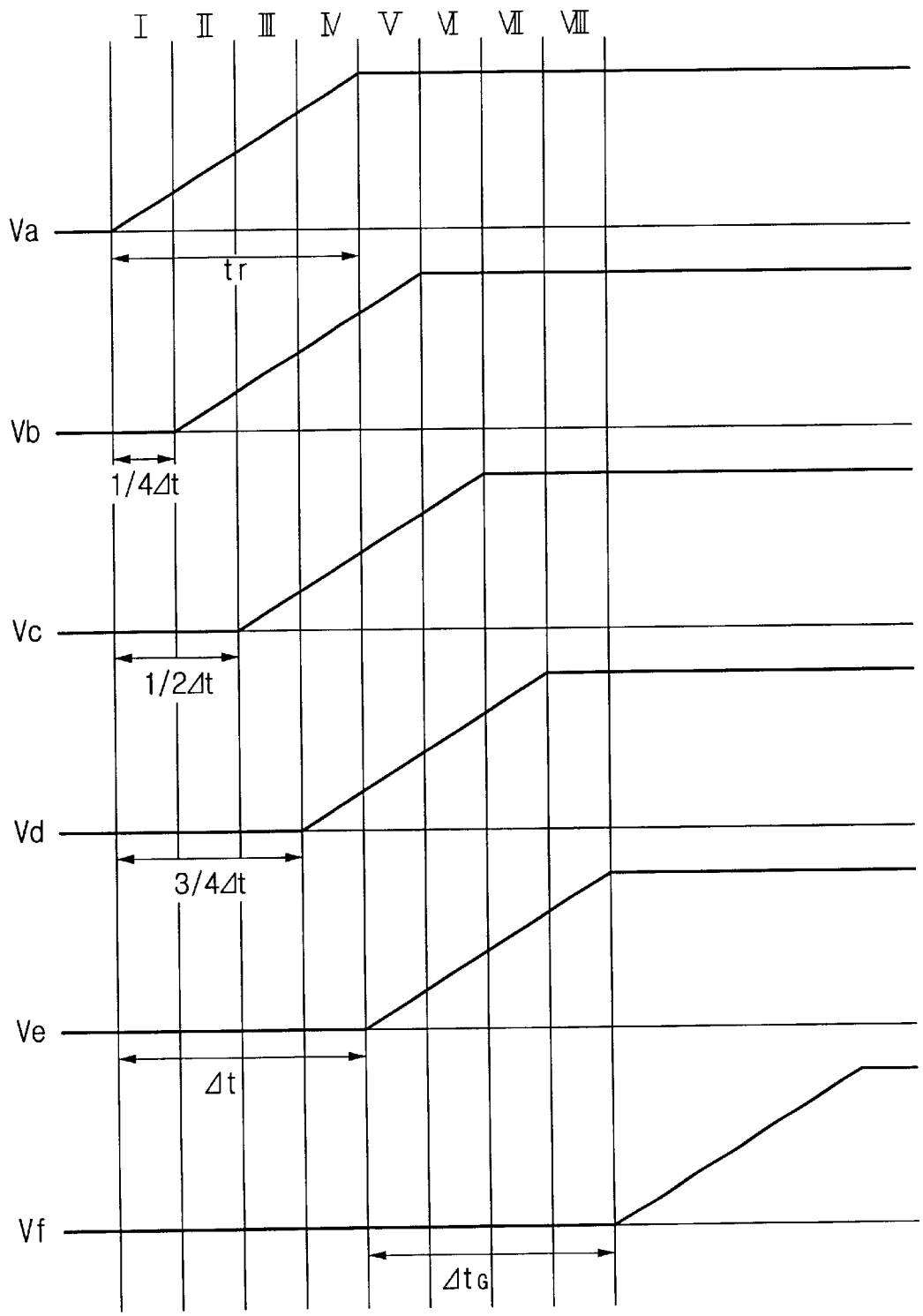
FIG. 8 is a graph for showing waveforms of diverse input voltages having different phase differences inputted to a phase blender.

FIG. 8 is a graph for showing waveforms of diverse input voltages having different phase differences inputted to a phase blender. As stated above, the first and second input voltages Vin1 and Vin2 have a certain phase difference, and the phase difference appears as a difference of input times in a time domain. When one input voltage is inverted from 'low' to 'high', the inversion is carried out over a certain rising time $t_r$, rather than a substantially instant inversion. In the description of the above prior art, the rising time of the input voltages Vin1 and Vin2 are not taken into consideration in order to briefly describe the operations that the phases of the input signals are inverted by inverters, but, actually, since the input voltages Vin1 and Vin2 have a certain rising time, voltages Va to Vf, if the input waveforms are shown by taking a rising time into consideration, have the waveforms rising over the rising time $t_r$ as shown in FIG. 8.

FIG. 8 is shown in some enlargement for the sake of a description of such rising time.

The respective voltages Va to Vf correspond to voltages having different phase differences with respect to a reference voltage Va. For example, Ve indicates a voltage having a difference by a rising time $t_r(=\Delta t)$ compared to the Va, Vb a voltage having a time difference of ¼ $\Delta t$ corresponding to ¼ of the time difference $\Delta t$, and Vf a voltage with a time difference larger by a certain time $\Delta t_G$ than the rising time $t_r$.

Figure 9:
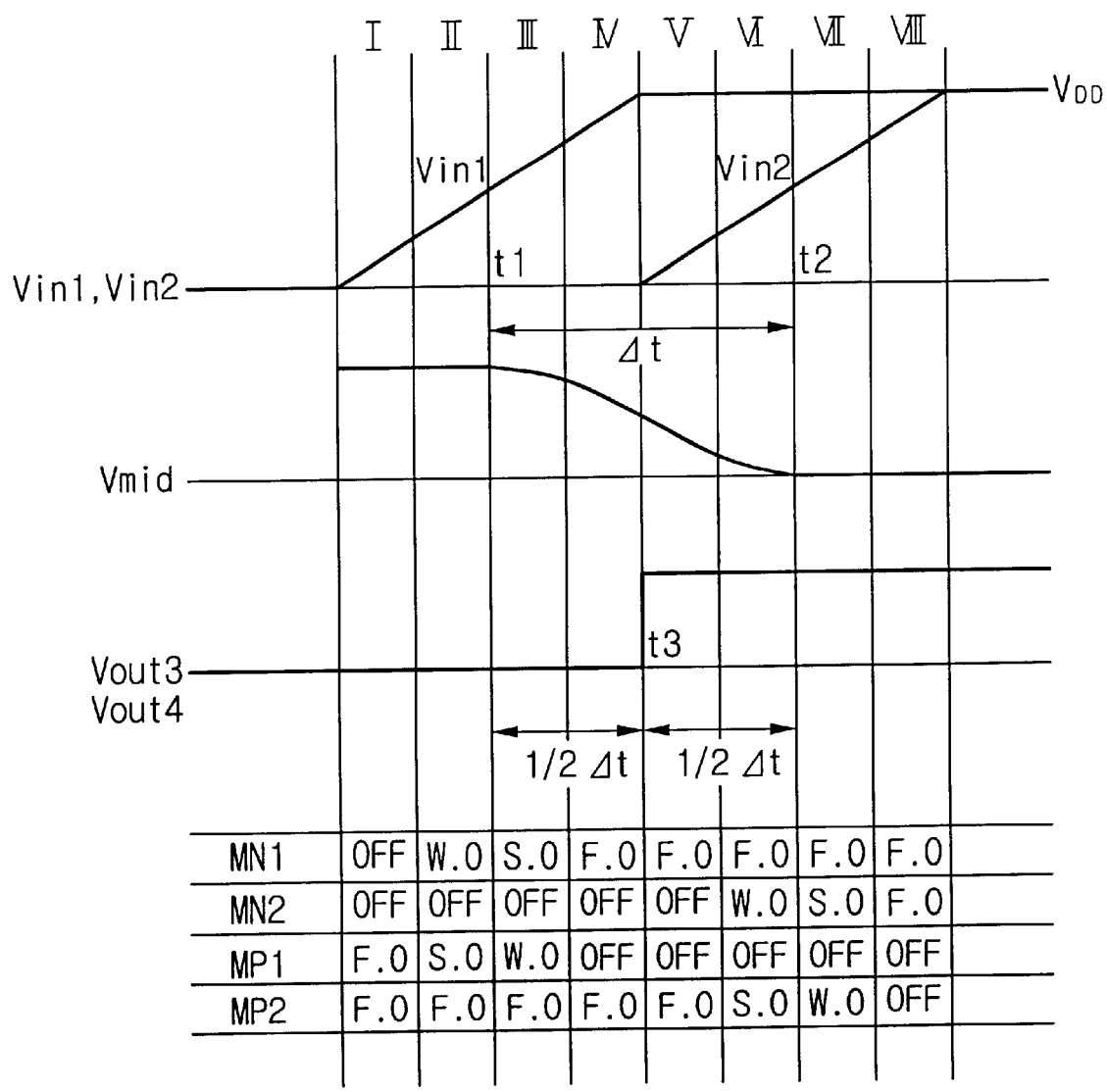
FIG. 9 is a graph for showing a relationship of input and output voltages of the circuit shown in FIG. 7.

FIG. 9 is a graph for showing a relationship of input and output voltages of the respective inverters of the intermediate phase output unit 130 shown in FIG. 7. The graph shows the case that the Va and Ve are selected as the first and second input voltages Vin1 and Vin2 of the voltage waveforms shown in FIG. 8, that is, the case of having a time difference $\Delta t$ by the rising time $t_r$.

In FIG. 9, the first input voltage Vin1 rises from section I to section IV, and the second input voltage Vin2 rises from section V to section VIII. A time that a value of the first input voltage Vin1 reaches about half of its final value is referred to as $t_1$, and a time that a value of the second input voltage Vin2 reaches about half of its final value is referred to as $t_2$. The first and second input voltages Vin1 and Vin2 can be supposed to be inverted at the times of $t_1$ and $t_2$, respectively, and the time difference $t_2 - t_1$ becomes a difference $\Delta t$ between the first and second input voltages Vin1 and Vin2.

In the sections (section I to section VIII) the first and second input voltages Vin1 and Vin2 rises, the operations of respective CMOS FETs MN1, MN2, MP1, and MP2 of the first inverters 131a and 131b are the same as shown in the table at the lower portion of FIG. 8. A detailed description of the table is as follows.

Substantially, in the operations of the respective CMOS FETs MN1, MN2, MP1, and MP2, the states of 'on' and 'off' are not inverted instantly, but inverted through a transition period. Accordingly, in the table, 'off' indicates that the respective CMOS FETs MN1, MN2, MP1, and MP2 operating as switches are in the state of 'off', 'w.o' in the state of 'weakly on', 's.o' in the state of 'strongly on', and 'f.o' in the state of 'fully on'.

First, of the first inverters 131a and 131b, the operations of CMOS FETs MN1 and MP1 to which the first input voltage Vin1 is inputted will be described as follows.

The MN1 is in the state of 'off' and the MT1 is in the state of 'on' until the MN1 reaches the section II, and then the MN1 is in the state of 'w.o' and the MP1 is in the state of 's.o' since the first input voltage Vin1 rises to an extent at their reach to the section II. During the section III, the first input voltage Vin1 rises further, so that the MN1 is in the state of 's.o' and the MP1 is in the state of 'w.o', and during the section IV, the MN1 is in the state of 'f.o' and the MP1 is in the state of 'off'. Such process is because the CMOS operates similarly to a resistor that varies its resistance value based on a gate voltage.

By the same principle as above, from section V to section VIII, of the first inverters 131a and 131b, the operations of the CMOS FETs MN1 and MP1 to which the second input voltage Vin2 is inputted are controlled by the second input voltage Vin2. That is, from section V to section VIII, the MN2 gradually changes the state from 'off' to 'f.o' and the MP2 changes the state from 'f.o' to 'off'.

As the states of the respective CMOS FETs MP1, MN1, MP2, and MN2 change as stated above, a value of the intermediate output voltage Vmid outputted decreases from section III to section VI as shown in FIG. 9. At this time, with a boundary of the timing (a boundary timing of section IV and section V=$t_3$) that an initial value of the intermediate output voltage Vmid decreases to about half of the initial value, the intermediate output voltage Vmid is inverted, so the output voltages Vout3 and Vout4 of the second inverters 132a and 132b are inverted from 'low' to 'high' at the boundary timing $t_3$. Substantially, the third and fourth output voltages Vout3 and Vout4 rise over some rising time as an inverting signal of the intermediate output voltage Vmid, but, in FIG. 9, voltage waveforms, without the rising times considered, are shown in order to explicitly indicate the inverting timings of the third and fourth output voltages Vout3 and Vout4. Further, substantially, the intermediate output voltage Vmid and the third and fourth output voltages Vout3 and Vout4 are outputted with a delay by delay times of the inverters. FIG. 8 shows waveforms without such time delays considered.

In the comparison of the inversion timings $t_1$ and $t_2$ of the respective first and second input voltages Vin1 and Vin2 with the inversion timing $t_3$ of the third and fourth output voltages Vout3 and Vout4, the third and fourth output voltages Vout3 and Vout4 are inverted at a time that is more delayed, by a half (½ $\Delta t$) of the time difference $\Delta t$ of the input voltages Vin1 and Vin2, than the first input voltage Vin1. Accordingly, the third and fourth output voltages Vout3 and Vout4 have an intermediate phase of the phases of the first and second input voltages Vin1 and Vin2.

With reference to FIG. 6 again, the output selection unit 140 includes a first multiplexer 141 for selectively outputting the first and third output voltages Vout1 and Vout3, and a second multiplexer 142 for selectively outputting the second and fourth output voltages Vout2 and Vout4. Accordingly, when the first multiplexer 141 is selected, the first output voltage Vout1 having a phase corresponding to the first input voltage Vin1 or the third output voltage Vout3 having an intermediate phase is outputted, and, when the second multiplexer 142 is selected, the second output voltage Vout2 having a phase corresponding to the second input voltage Vin2 or the fourth output voltage Vout4 having an intermediate phase is outputted.

Each of the multiplexers 141 and 142 performs selection operations based on one selection signal sell. At this time, if the selection signal sell is 'low', the first multiplexer 141 outputs the first output voltage Vout1, and the second multiplexer 142 outputs the fourth output voltage Vout4. If the selection signal sell is 'high', the first multiplexer 141 outputs the third output voltage Vout3 and the second multiplexer 142 outputs the second output voltage Vout2. Accordingly, in case that the selection signal sell is 'low', the first output voltage Vout1 having a phase corresponding to the first input voltage Vin1 and the fourth output voltage Vout4 having a phase delay corresponding to a half of a phase difference of the input voltages Vin1 and Vin2 are outputted, and, if the selection signal sell is 'high', the third output voltage Vout3 having a phase delay corresponding to a half of a phase difference of the input voltages Vin1 and Vin2 and the second output voltage Vout2 having a phase corresponding to the second input voltage Vin2 are outputted. According to this, the phase blender 120 can output a pair of voltages having a phase difference corresponding to a half of a phase difference of the input voltages Vin1 and Vin2. At this time, a phase delay amount of the output voltages can be adjusted by controlling the selection signal sel1 inputted to the multiplexers 141 and 142.

Although the embodiment shown in FIG. 6 shows a case that one selection signal is inputted to the multiplexers 141 and 142, it may be possible for different selection signals to be inputted to the multiplexers 141 and 142. In such a case, the first multiplexer 141 can select one of the first and third output voltages Vout1 and Vout3, and the second multiplexer 142 can select one of the fourth and second output voltages Vout4 and Vout2. Accordingly, it is possible to select and output two output voltages Vout1 and Vout2 having the same phase difference as those of the input voltages Vin1 and Vin2.

In the meantime, capacitors $C_1$ and $C_2$ may be installed at the input state of the phase blender 120. These capacitors $C_1$ and $C_2$, as described later in detail, are installed to correct the case that unstable operation sections due to an excessive time difference of the input voltages Vin1 and Vin2 exists. Further, as described later, these capacitors may be dummy capacitors constituted with more than one floating inverter.

The phase blender 120 having the above structure according to an embodiment of the present invention has an advantage in that inverters are easily constructed compared to a conventional method in which one second inverter is installed, since the number of the first and second inverters 131a and 131b is the same as that of the second inverters 132a and 132b. That is, the conventional phase blender has a problem of experimentally adjusting a capacity ratio of the first inverters in order to output an exact intermediate phase because the loads of the first and second inverters are different, but, in the present invention, the construction of a circuit becomes facilitated, since the loads of the first inverters 131a and 131b and the second inverters 132a and 132b are the same to thereby enable all the inverters to have the same capacity.

Further, the phase blender 120 according to the present invention has the multiplexers 141 and 142 therein, thereby enabling a multi-phase generator of a cascade structure to be formed, as described later.

Figure 10:
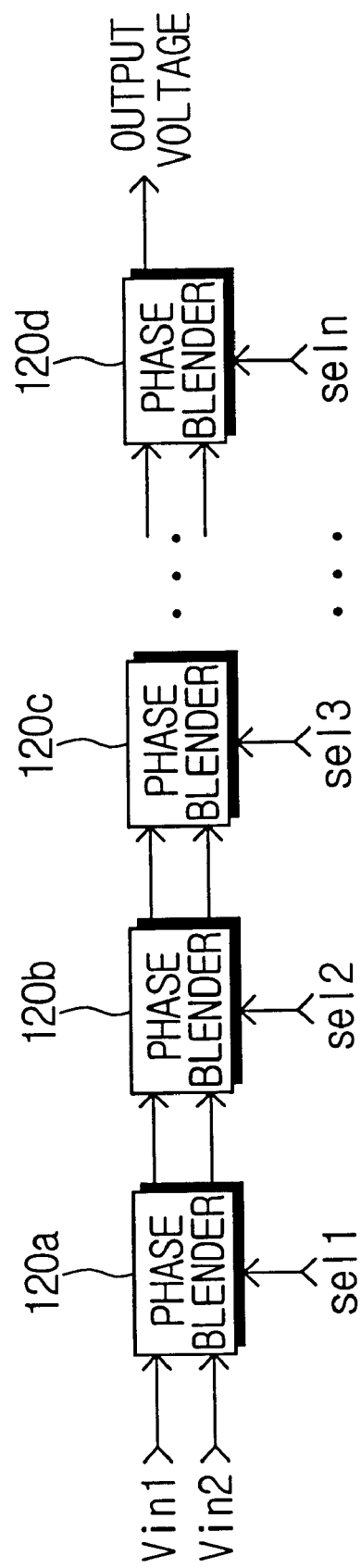
FIG. 10 is a block diagram for showing a multi-phase generator according to an embodiment of the present invention.

FIG. 10 shows a multi-phase generator using the above phase blender 120 according to an embodiment of the present invention. The multi-phase generator according to the present invention has a first phase blender 120a and a second phase blender 120b connected in series with the first phase blender 120a, which have the same structure as the phase blender 120, and other phase blenders 120c and 120d are sequentially connected in series to the second phase blender 120b. The two input voltages Vin1 and Vin2 as stated above are inputted to the phase blender 120a of the first stage, and outputs of preceding phase blenders are inputted to the phase blender 120b of the second stage and the phase blenders 120c and 120d of the stages after the second stage.

With use of the multi-phase generator having the above structure, the phase blender 120a of the first stage controls the selection signal sel1 which drives the multiplexers therein, to thereby enable two voltages having a half of a phase difference of the input voltages Vin1 and Vin2 to be outputted. The two output voltages are inputted to the phase blender 120b of the second stage, and the phase blender 120b of the second stage outputs two voltages having a half of a phase difference of the input voltages thereof, to thereby output two voltages having a phase difference of a quarter of the phase difference of the input voltages Vin1 and Vin2.

For example, if Va and Ve in FIG. 8 are inputted to the first phase blender 120a, the first phase blender 120a can output a voltage of the same waveform as the Vc having its intermediate phase, and, again, the Va (or Ve) and Vc are inputted to the second phase blender, to thereby output a voltage of the same waveform as the Vb (or Vd).

As the above operations are repeated in the phase blenders 120c and 120d of the following stages, the phase blender 120d of the final stage can select and output one of the various voltages having a small phase difference. Accordingly, the phase blender 120d of the final stage can output a voltage having a phase difference of as many as $\frac{1}{2}^N$ Δt, in case of a multi-phase generator constituted with N phase blenders 120a to 120d.

At this time, the output of the phase blender 120d has a phase difference of $\frac{1}{2}^N$ Δt, but the extent of the phase delay can be adjusted by suitably selecting the selection signals sel1 to seln of the respective phase blenders 120a to 120d. That is, for example, if a multi-phase generator is constituted with four phase blenders, two output voltages having a phase difference of $\frac{1}{16}$ Δt from the phase blender of the final stage. At this time, if the selection signals sel1 to seln are set to '0000', since the two output voltages become the voltages without a phase delay amount (substantially, two output voltages having a phase delayed by a phase delay amount due to the four phase blenders), the multi-phase generator outputs one output voltage having a phase corresponding to the first input voltage Vin1 and another output voltage having a phase delayed by $\frac{1}{16}$ Δt compared to the one output voltage. Likewise, if the selection signals sel1 to seln are selected as '1111', the multi-phase generator outputs one output voltage having a phase corresponding to the second input voltage Vin2 and another output voltage having a phase anteceded by $\frac{1}{16}$ Δt compared to the one output voltage. Accordingly, output voltages having a different phase delay amount can be outputted by controlling the selection signals sel1 to seln.

FIG. 10 shows the case that an output voltage is outputted from the phase blender 120d of the final stage, but the output voltage may be taken from the phase blenders 120a, 120b, or 120c in the middle portion, which enables two output voltages having a different phase difference, that is, a phase difference larger than $\frac{1}{2}^N$Δt to be obtained. At this time, a phase delay amount of the two output voltages can be controlled by adjusting the respective selection signals as stated above.

Further, as described above, even in case of inputting two selection signals to the respective phase blenders and obtaining an output voltage only from the phase blender 120d of the final stage rather than the middle phase blenders 120a, 120b, or 120c, the phase difference of the output voltage can be controlled together with the phase delay amount by adjusting the selection signals of the respective phase blenders 120a, 120b, 120c, and 120d.

The use of the multi-phase generator as stated above according to the present invention reduces the number of phase blenders required compared to the conventional multi-phase generator that exponentially increases the number of phase blenders as the number of stages increases. Accordingly, the multi-phase generator according to the present invention has an advantage in that the size of a circuit decreases as well as the consumption of electric power decreases.

Figure 11:
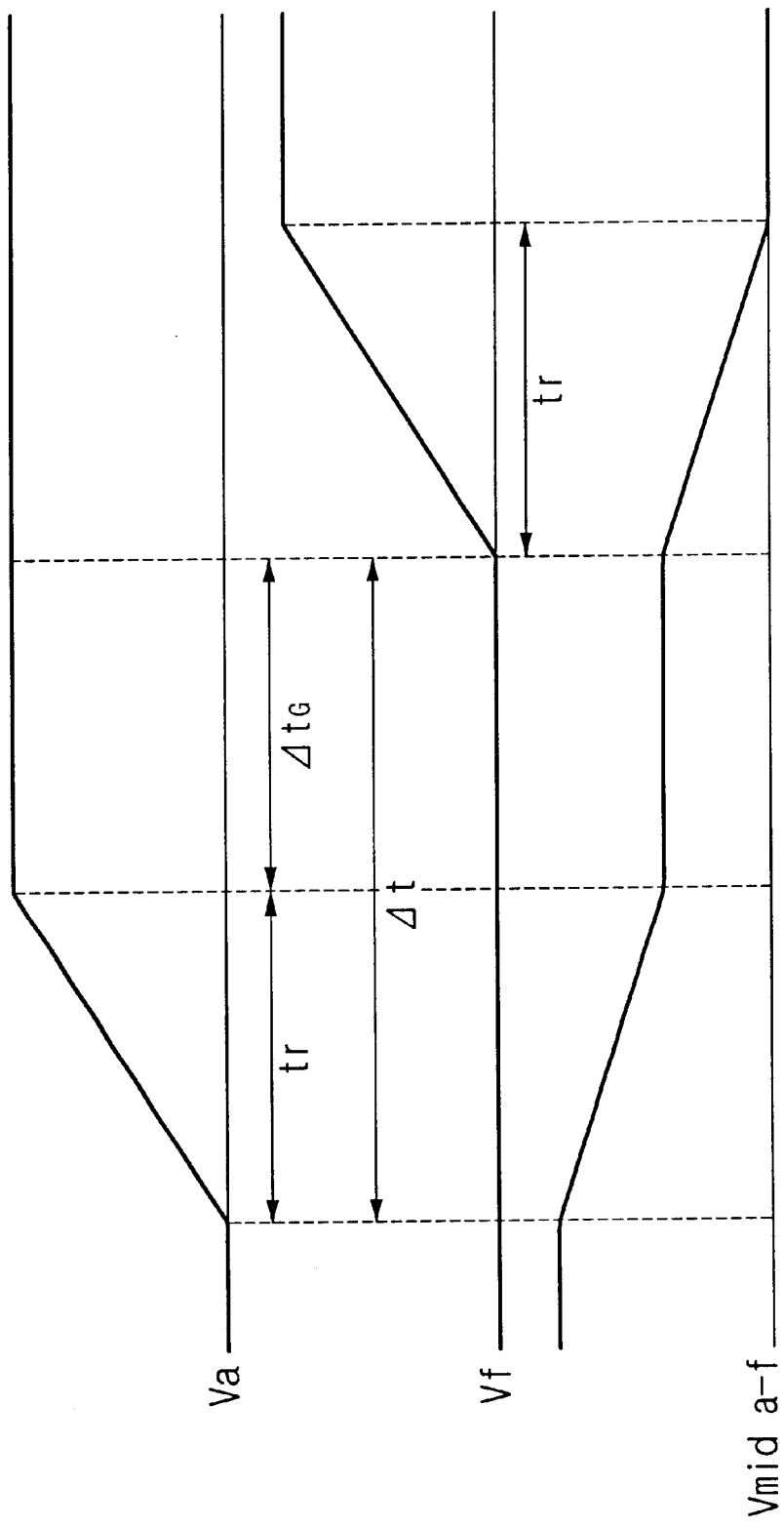
FIG. 11 is a graph for showing a relationship of input and output voltages for explanations of a tolerance range of a phase difference of an input voltage for normal operations of the phase blender.

FIG. 11 is a graph for showing a relationship of input and output voltages for an explanation of a tolerance range of a phase difference of input voltages in order to normally operate the phase blender 120 as shown in FIG. 6. The phase blender 120 as stated above and the multi-phase generator using the same normally operate only in case that a phase difference of the input voltages Vin1 and vin2 is in a certain tolerance range. For example, as shown in FIG. 11, in case that the Va and Vf of the waveforms shown in FIG. 8 are selected as the first and second input voltages Vin1 and Vin2, since there is a certain time difference $\Delta t_G$ between the time when the rising of the Va is completed and the time when the rising of the Vf starts, the phase blender 120 outputs an intermediate output voltage Vmid a–f having an intermediate magnitude between 'high' and 'low' in an interval in which the time difference $\Delta t_G$ exists. Accordingly, since a voltage of such ambiguous magnitude is inputted to the second inverters 132a and 132b in the intermediate phase output unit 130, the output of the intermediate phase output unit 130 does not indicate one of 'low' and 'high' explicitly. Accordingly, the phase blender 120 has a malfunction.

In order to solve the above problem, the unstable operation interval $\Delta t_G$ as stated above should be prevented by getting the input voltages Vin1 and Vin2 to have a time difference smaller than the rising times of the Va and Ve in FIG. 8.

Figure 12:
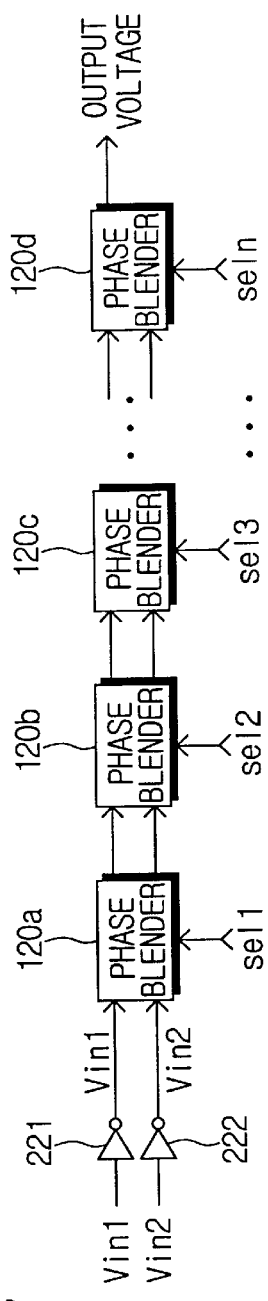
FIG. 12 to FIG. 14 are views for showing a multi-phase generator according to other embodiments of the present invention.
Figure 13:
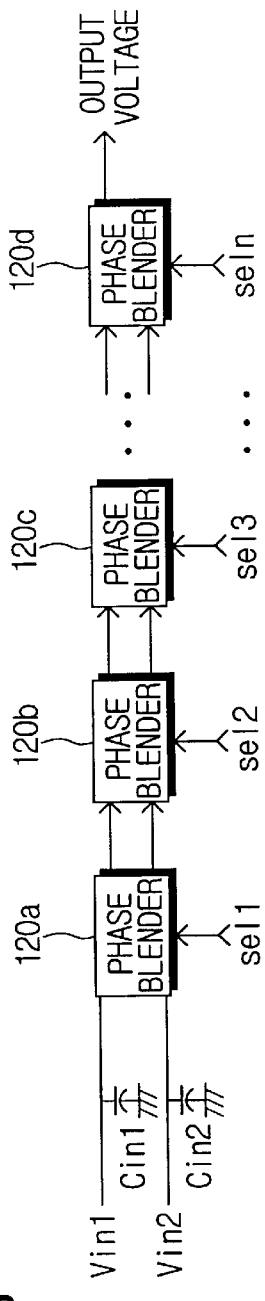
Figure 14:
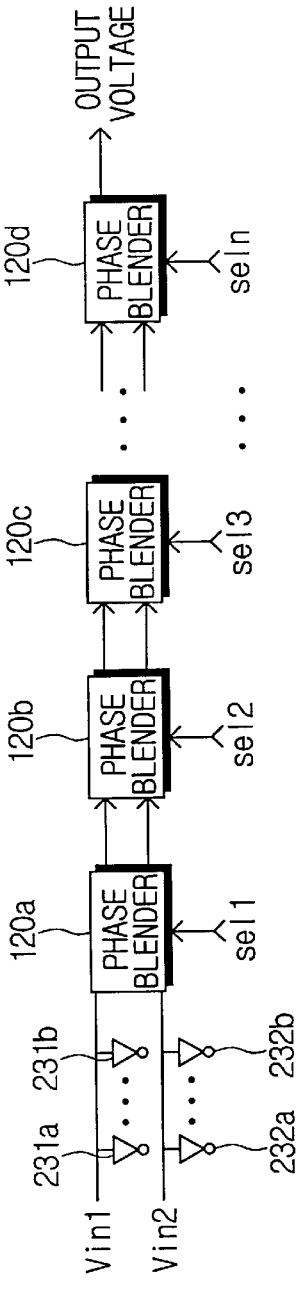

FIG. 12 to FIG. 14 are views for showing other embodiments of the multi-phase generator equipped with a unit for removing the unstable operation interval $\Delta t_G$. In order to solve the above problem, the present embodiments propose methods for delaying the rising times $t_r$ of the first and second input voltages Vin1 and Vin2 inputted to the first phase blender.

In FIG. 12, a method is proposed in which first and second delay inverters 221 and 222 are inserted between a portion for supplying the first and second input voltages Vin1 and Vin2 in order to delay the rising time $t_r$ and the first phase blender 120a. At this time, the delay inverters 221 and 222 are constituted with CMOS, the sizes of which are smaller than those of the inverters 121a, 121b, 122a, 122b, 131a, 131b, 132a, and 132b in the first phase blender 120a. Accordingly, the load of the first phase blender 120a becomes relatively larger than that of the respective delay inverters 221 and 222, so that the rising time $t_r$ is lengthened.

In FIG. 13, a method is proposed in which capacitors Cin1 and Cin2 are installed at the input stage of the first phase blender 120a in order to delay the rising time $t_r$. The capacitors Cin1 and Cin2 charge the first and second input voltages Vin1 and Vin2, so that the rising times of the first and second input voltages get delayed.

In FIG. 14, a method is proposed in which dummy capacitors 231a, 231b, 232a, and 232b are installed at the input stage of the first phase blender 120a in order to increase the rising time $t_r$. Here, the dummy capacitors 231a, 231b, 232a, and 232b are installed at the input stage of the first phase blender 120a, which can be constituted with floating inverters open at their output ports. In case of installing the floating inverters at the input stage of the first phase blender 120a, the floating inverters function as the dummy capacitors of carrying out the same performance as capacitors with respect to the first and second input voltages Vin1 and Vin2. Here, the input stages of the first phase blenders 120a each may have one floating inverter, as shown in FIG. 14, may have plural floating inverters. In case that an adjustment of the rising time $t_r$ is required, the capacity of the capacitor or the floating inverter may be controlled, but, adjusting the number of floating inverters as stated above brings the same effect as controlling the capacity of capacitors as a result, to thereby enable the adjustment of the rising time $t_r$.

Figure 15:
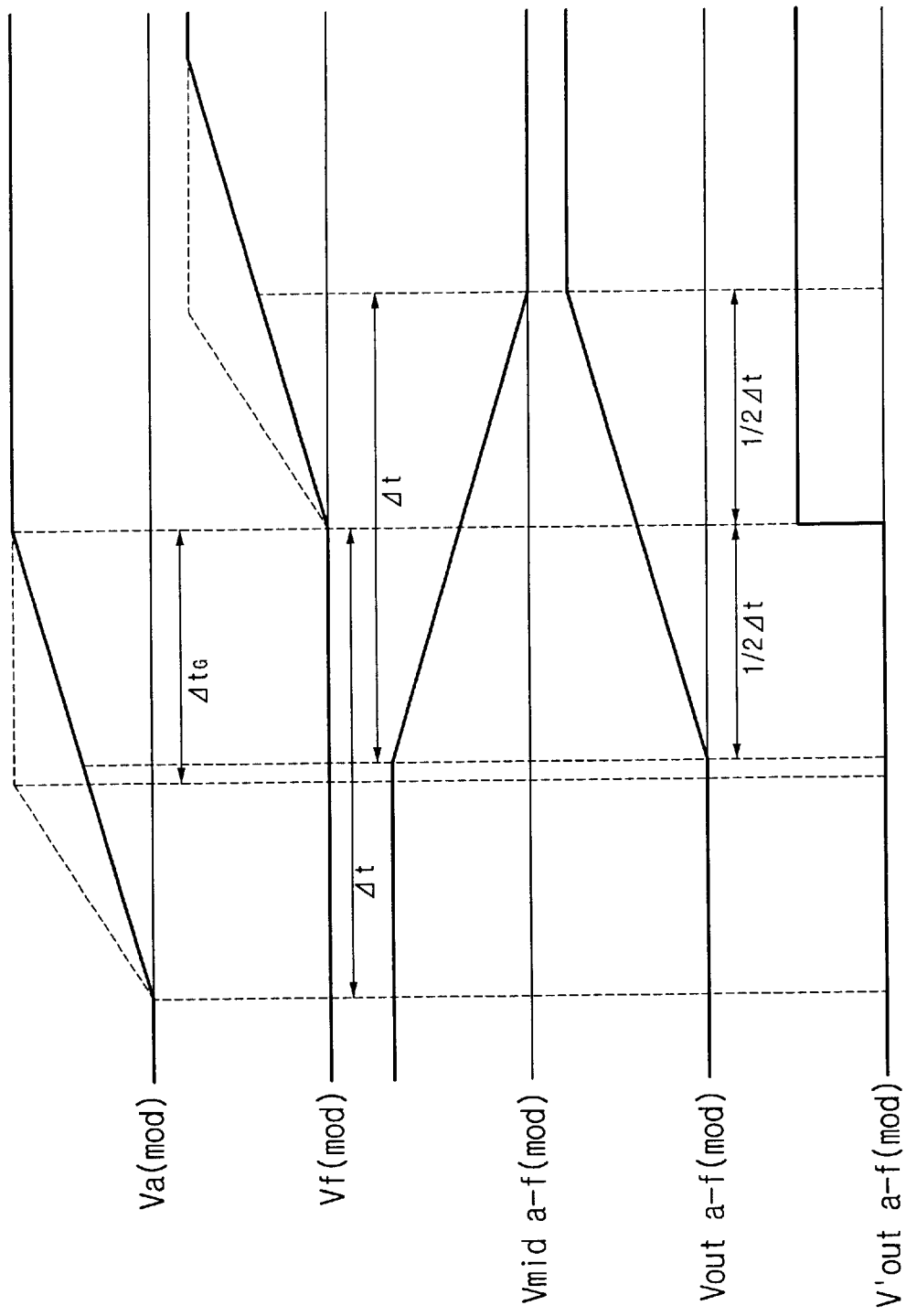
FIG. 15 is a graph for showing a relationship of input and output voltages for explanations of operations of the multi-phase generator according to the embodiments of FIG. 12 to FIG. 14.

FIG. 15 is a graph for showing a relationship of input and output voltages for explanations of operations of the multi-phase generator according to the embodiments of FIG. 12 to FIG. 14. As shown in FIG. 11, in case that there is a certain unstable operating interval $\Delta t_G$ present since the input time differences of the input voltages are excessively large, the increase of the rising time $t_r$ as shown in FIG. 15 can remove the unstable operation interval $\Delta t_G$ by reducing slopes of the input waveforms. If the rising time $t_r$ is delayed, the rising of the second input voltage Vin2 can get started before rising the first input voltage Vin1 to reach a final value, which can remove the unstable operation interval $\Delta t_G$. The waveforms of a dotted line from the voltage waveforms in FIG. 15 indicate the original Va and Vf waveforms, and the waveforms $Va_{(mod)}$ and $Vf_{(mod)}$ of a solid line are waveforms after increasing the delay time $t_r$ as stated above. Accordingly, in case that the waveforms having an increased delay time $t_r$ are inputted, an intermediate output voltage Vmid a–$f_{(mod)}$ causes the unstable operation interval $\Delta t_G$ to be removed, to thereby form a normal waveform, as shown in FIG. 15. An output Vout a–$f_{(mod)}$ of the second inverters 132a and 132b becomes an output which inverts the intermediate output voltage Vmid a–$f_{(mod)}$. Further, if the output voltage Vout a–$f_{(mod)}$ is converted from a 'low' state to a 'high' state at a time of becoming a half of the final output voltage value, the final output voltage is the same as V'out a–$f_{(mod)}$. Accordingly, a voltage having an intermediate time difference ½ $\Delta t$ of the time difference of the input voltages Va and Vf becomes outputted.

The delay inverters 221 and 222, capacitors $C_{in1}$ and $C_{in2}$, or dummy capacitors 231a, 231b, 232a, and 232b are installed only at the phase blender 120a of the first stage.

If normally operated at the first stage, an unstable operation interval $\Delta t_G$ does not exist since the phase difference gradually decreases at the phase blenders 120b, 120c, and 120d present after the second stage.

According to the present invention, a phase blender is provided, the circuit of which is easily constructed since the capacity of the inverters is the same, and which facilitates the occurrence of an intermediate phase with built-in multiplexers and enables a multi-phase generator of a simple structure to be constructed.

Further, according to the present invention, by using the smaller number of phase blenders, a multi-phase generator having a simple structure and a small power consumption is provided, and, particularly, a multi-phase generator is provided which removes an unstable operation interval that may occur in case that the time differences of the input voltages are large. The multi-phase generator according to the present invention minimizes a nonlinear effect due to RC filtering.

Although the preferred embodiments of the present invention have been described, it will be understood by those skilled in the art that the present invention should not be limited to the described preferred embodiments, but various changes and modifications can be made within the spirit and scope of the present invention as defined by the appended claims.

What is claimed is:

1. A phase blender, comprising:
   first and second phase delay units for respectively inputting first and second input voltages having a certain phase difference from each other, and outputting first and second output voltages having phases corresponding to phases of the first and second input voltages respectively;
   an intermediate phase output unit having a pair of first inverters for inputting the first and second input voltages, respectively, the output ports of the first inverters being mutually connected, and a pair of second inverters for inputting the output voltages of the first inverters and outputting third and fourth output voltages, respectively; and an output selection unit having a first multiplexer for selectively outputting the first and third output voltages, and a second multiplexer for selectively outputting the second and fourth output voltages, wherein the first and second inverters each include PMOS and NMOS transistors which perform mutually opposite switching operations according to the magnitudes of the voltages inputted to the gates thereof, and the first and second input voltages are inputted to the gates of the PMOS and NMOS transistors, whereby the third and fourth output voltages have an intermediate phase between the phases of the first and second output voltages.

2. The phase blender as claimed in claim 1, wherein the first and second phase delay units each include a pair of third inverters connected in series to each other.

3. The phase blender as claimed in claim 1, further comprising a delaying unit for delaying rising times of the first and second input voltages.

4. The phase blender as claimed in claim 3, wherein the delaying unit is a delay inverter having a size smaller than the respective first and second inverters and installed at portions to which the first and second input voltages are inputted.

5. The phase blender as claimed in claim 3, wherein the delaying unit is a capacitor installed at portions to which the first and second input voltages are inputted and charging the first and second input voltages.

6. The phase blender as claimed in claim 3, wherein the delaying unit is a floating inverter installed at portions to which the first and second input voltages are inputted, having an opened output port, and performing a function of a dummy capacitor with respect to the first and second input voltages.

7. The phase blender as claimed in claim 6, wherein plural floating inverters are installed with respect to each of the first and second input voltages.

8. A multi-phase generator, comprising:

a first phase blender for inputting first and second input voltages having a certain phase difference and selectively outputting at least two voltages based on voltages having phases corresponding to phases of the first and second input voltages and based on other voltages having a phase corresponding to an intermediate phase of the first and second input voltages; and at least one second phase blender sequentially connected in series to the first phase blender, and for performing the same function as the first phase blender, wherein each of the phase blenders comprises:

first and second phase delay units for inputting the first and second input voltages, respectively, and outputting first and second output voltages having phases corresponding to the phases of the first and second input voltages, respectively;

an intermediate phase output unit having a pair of first inverters for inputting the first and second input voltages, respectively, the output ports of the first inverters being connected to each other, and a pair of second inverters for inputting output voltages of the first inverters and outputting third and fourth output voltages, respectively; and an output selection unit having a first multiplexer for selectively outputting the first and third output voltages, and a second multiplexer for selectively outputting the second and fourth output voltages, wherein the first and second inverters each include PMOS and NMOS transistors which perform mutually opposite switching operations according to the magnitudes of the voltages inputted to the gates thereof, and the first and second input voltages are inputted to the gates of the PMOS and NMOS transistors, whereby the third and fourth output voltages have an intermediate phase between the phases of the first and second output voltages.

9. The multi-phase generator as claimed in claim 8, further comprising a delaying unit for delaying rising times of the first and second input voltages inputted to the first phase blender.

10. The multi-phase generator as claimed in claim 9, wherein the delaying unit is a delay inverter having a size smaller than the first and second inverters in the first phase blender and installed between the first and second input voltages and the first phase blender.

11. The multi-phase generator as claimed in claim 9, wherein the delaying unit is a capacitor installed at the input stage of the first phase blender and charging the first and second input voltages.

12. The multi-phase generator as claimed in claim 9, wherein the delaying unit is a floating inverter installed at the input stage of the first phase blender, having an opened output port, and performing a function of a dummy capacitor with respect to the first and second input voltages.

13. The multi-phase generator as claimed in claim 12, wherein plural floating inverters are installed at each input stage of the first phase blender.

* * * * *